United States Patent [19]

Hsu

[11] 4,295,266

[45] Oct. 20, 1981

[54] METHOD OF MANUFACTURING BULK CMOS INTEGRATED CIRCUITS

[75] Inventor: Sheng T. Hsu, West Windsor, N.J.

[73] Assignee: RCA Corporation, New York, N.Y.

[21] Appl. No.: 164,681

[22] Filed: Jun. 30, 1980

[51] Int. Cl.³ .............................................. H01L 21/26
[52] U.S. Cl. .................................. 29/571; 29/576 B; 148/1.5; 148/187; 352/44
[58] Field of Search ............... 29/571, 576 B; 148/1.5, 148/187; 352/44

[56] References Cited

U.S. PATENT DOCUMENTS

| | | | |
|---|---|---|---|
| 3,751,722 | 8/1973 | Richman | 29/571 X |
| 3,755,001 | 8/1973 | Kooi et al. | 148/187 X |
| 3,853,633 | 12/1974 | Armstrong | 148/1.5 |
| 4,013,484 | 3/1977 | Boleky et al. | 148/1.5 |
| 4,027,380 | 6/1977 | Deal et al. | 29/571 |
| 4,135,955 | 1/1979 | Gasner et al. | 148/187 |
| 4,221,045 | 9/1980 | Godejahn | 29/571 |

OTHER PUBLICATIONS

Nakajima et al., "Defects in a Gate Oxide Grown After the LOCOS Process", *Jpn. J. of Appl. Physics*, vol. 18, No. 5, May 1979, pp. 943–951.

*Primary Examiner*—G. Ozaki
*Attorney, Agent, or Firm*—Birgit E. Morris; Donald S. Cohen; Sanford J. Asman

[57] ABSTRACT

The method presented may be utilized in manufacturing CMOS integrated circuits either in an isoplanar or in a LOCOS process. The method entails the simultaneous formation of the well region with the oxide isolation regions by a drive-in diffusion which is conducted in a dry oxygen ambient. The utilization of the process insures that compounds of silicon, nitrogen and oxygen will not be present in the bulk silicon where they can effect the quality of gate oxides which are subsequently formed.

7 Claims, 7 Drawing Figures

METHOD OF MANUFACTURING BULK CMOS INTEGRATED CIRCUITS

BACKGROUND OF THE INVENTION

The present invention relates to a method for manufacturing integrated circuits.

In the manufacture of complementary symmetry metal oxide semiconductor (CMOS) integrated circuits in bulk silicon substrates, it is necessary to form a well of opposite conductivity type to the substrate in order to have a location in which to form complementary transistors. For example, a typical CMOS process utilizes an N type silicon substrate in which a P type well is formed. The P channel transistors are formed in the N type substrate, and the N channel transistors are formed in the P wells. When CMOS integrated circuits are manufactured using either an isoplanar or a local oxidation on silicon (LOCOS) process, a number of manufacturing steps are required for the purpose of forming the well and providing the inter-transistor oxidation regions required by the isoplanar or the LOCOS procedures.

Heretofore, typical isoplanar and LOCOS processes utilized silicon nitride ($Si_3N_4$) layers for defining the silicon dioxide layers in etching steps. They also utilized oxidation in a steam ambient at high temperature.

It has been found that high temperature steam oxidation introduces silicon nitride into the silicon surface. The introduction of silicon nitride causes compounds of silicon, nitrogen, and oxygen to be present in the channel region of the transistors formed. Such compounds have been found to cause defects in the gate oxide, resulting in transistors having low breakdown voltages and unstable characteristics. However, there is no easy way to remove such compounds from the silicon surface once they have formed.

Summary of the Invention

In accordance with the present invention, a process for making CMOS integrated circuits in bulk silicon is described. The process can be used either with isoplanar or LOCOS processing techniques. The present invention utilizes a high energy ion implant to implant ions into the substrate which will form the well, and it uses a dry oxidation and drive-in diffusion to simultaneously complete the formation of the well while forming the LOCOS or isoplanar oxide regions. The present process has been found to prevent the formation of silicon, nitrogen, and oxygen compounds the bulk silicon.

DETAILED DESCRIPTION OF AN EXEMPLARY EMBODIMENT

Figure 1:
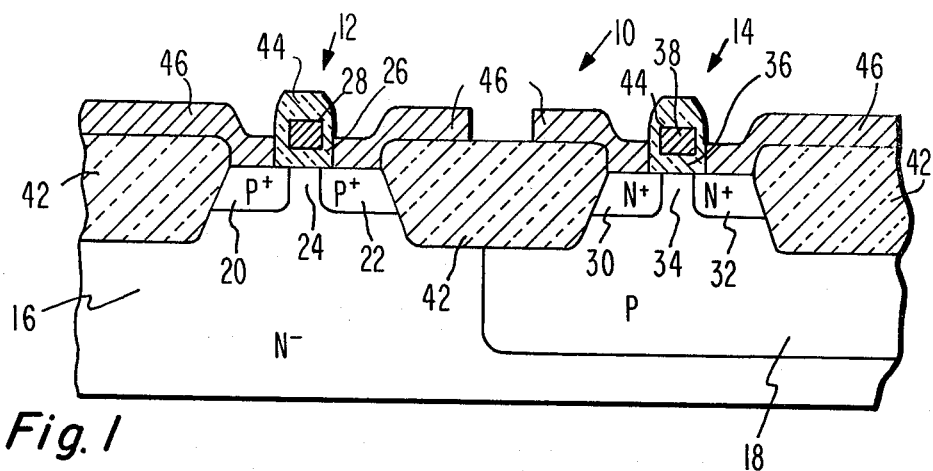
FIG. 1 is a cross-sectional view of one type of device manufactured in accordance with the present invention.

Referring now to FIG. 1, a cross-sectional view of a portion of an integrated circuit 10 manufactured in accordance with the preferred embodiment of the present invention, namely an isoplanar method, is shown.

The integrated circuit 10 comprises a P channel transistor 12 and an N channel transistor 14. The integrated circuit 10 is formed in a substrate 16, which is comprised of N- silicon in the preferred embodiment of the invention. The P channel transistor 12 is formed in the substrate 16. The N channel transitor 14 is formed in a P well 18 which is formed in the substrate 16.

The P channel transistor 12 comprises a P+ source 20 and a P+ drain 22 which are separated from one another by a portion of the N- substrate 16 which acts as the channel region 24 of the transistor 12. A gate oxide layer 26 overlies the channel region 24, and a conductive polycrystalline silicon gate 28 overlies the gate oxide layer 26.

The N channel transistor 14 comprises an N+ source 30 and a N+ drain 32 which are separated from one another by a portion of the P well 18 which acts as the channel region 34 of the transistor 14. A gate oxide layer 36 overlies the channel region 34, and a conductive polycrystalline silicon gate 38 overlies the gate oxide layer 36.

The transistors 12, 14 are separated by oxide regions 42 which extend into the substrate 16 and into the P well 18 in the normal manner used in isoplanar integrated circuits. Overlying the gates 28, 38 are field oxide regions 44. Metal conductors 46 are used to contact the sources 20, 30 and the drains 22, 32 of the transistors 12, 14.

Figure 2:
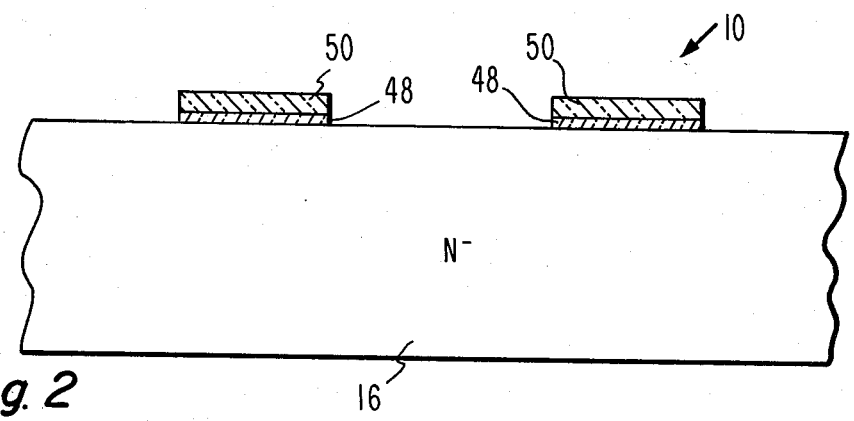
FIGS. 2-5 are cross-sectional views illustrating the method of manufacturing the device shown in FIG. 1.

Referring now to FIGS. 2-5, the method of manufacturing the integrated circuit 10 will be described. One starts with an N-type silicon substrate 16, as shown in FIG. 2. In the preferred embodiment of the invention, a layer comprising 400 to 500 angstroms of silicon dioxide is thermally grown on the surface of the substrate 16. Thereafter, about 1000 to 3000 angstroms of silicon nitride is deposited on the surface of the silicon dioxide. Then, about 2000 angstroms of silicon dioxide is chemically deposited from vapor on the surface of the silicon nitride layer. Finally, a photoresist layer (not shown) is applied to the surface of the deposited silicon dioxide layer.

Through the use of a first photolithographic step, the photoresist layer is defined to overlie areas where the transistors 12, 14 will be formed. The defined photoresist layer is developd to provide an etch mask which is used in etching the chemically deposited silicon dioxide layer, typically in an etchant comprising buffered hydroflouric acid. The photoresist mask is then stripped, and the defined silicon dioxide layer is used as an etch mask to define the silicon nitride layer in an etchant which typically comprises hot phosphoric acid. Next, the defined silicon nitride layer is used as a etch mask to define the overlying layer of thermally grown silicon dioxide in an etchant solution which typically comprises buffered hydroflouric acid. If the substrate 16 is left in the buffered hydroflouric acid for a long enough period of time, the chemically deposited silicon dioxide will be removed. The remaining structure will appear in cross-section as shown in FIG. 2 with the defined thermally grown silicon dioxide region 48 covered by the defined silicon nitride region 50.

Figure 3:
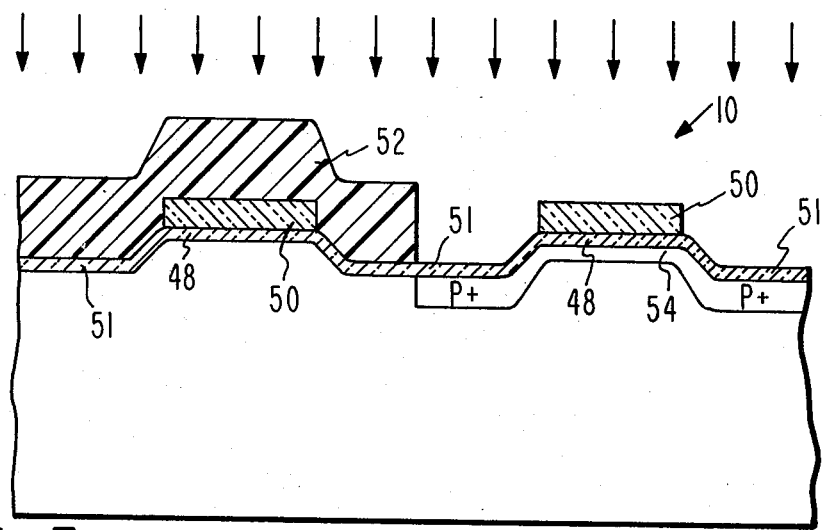

Referring now to FIG. 3, the partially formed integrated circuit 10 is placed into a solution which will selectively etch silicon, rather than silicon nitride. Typically, a potassium hydroxide solution is used to etch the exposed portions of the silicon substrate 16 to a depth equal to about ½ the thickness of the required field oxide.

In the opinion of some semiconductor process engineers, photoresist adheres better to a silicon dioxide layer than to a silicon surface. Accordingly, the partially formed integrated circuit 10 may be placed into a furnace in an oxidizing ambient for a time sufficient to grow oxide layers 51 to a thickness of about 1000 angstroms on the exposed portions of the silicon substrate 16. This step may, however, be avoided if the oxide layers 51 are not wanted to enhance photoresist adhesion.

A second photoresist layer is applied over the surface of the partially formed integrated circuit 10, and a second photolithographic step is used to define openings in the photoresist layer where P wells are to be formed. The photoresist layer is then developed to provide a mask 52 which is used in a high energy implantation of acceptor ions, such as boron. In accordance with the preferred embodiment of the invention, boron ions are implanted (represented by the arrows in FIG. 3) at an energy which is high enough to cause the implanted ions to pass through the exposed silicon nitride layer 50 and the overlying thermally grown silicon dioxide layer 48 and into the substrate 16 to form a shallow P+ region 54. Then, the photoresist mask 52 is stripped.

Figure 4:
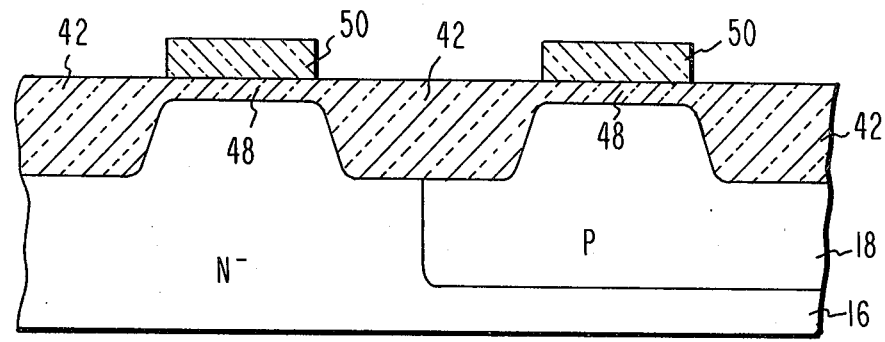

The next step which is performed is critical to the present invention. It is the drive-in diffusion of the boron ions from the shallow P+ region 54 into the substrate 16 to form the P well 18. This step is critical in that it must be conducted in a dry oxygen ambient. Approximately 6000 angstroms of silicon dioxide will be thermally grown, as shown in FIG. 4, forming the oxide regions 42. Simultaneously, the boron ions from the P+ region 54 (shown in FIG. 3) will be diffused about 8 microns into the substrate 16 to form the P well 18. If a deeper P well 18 is desired, additional diffusion can be conducted in a non-oxidizing ambient, such as nitrogen.

Figure 5:
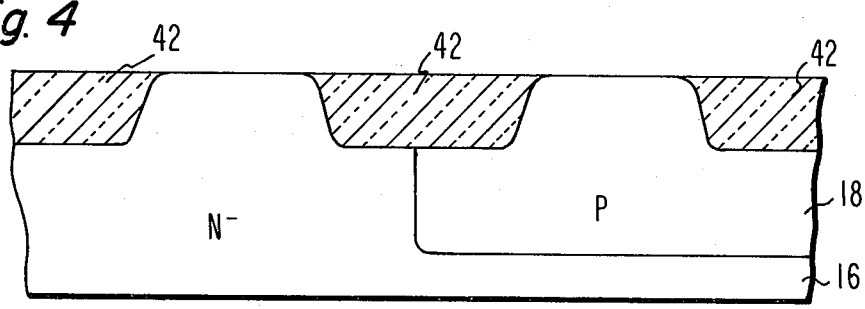

Next, the silicon nitride and silicon dioxide layers 50, 48 are removed to yield the structure shown in FIG. 5 in which the portions of the substrate 16 and portions of the P well 18, where the transistors 12, 14 are to be formed, are exposed. If the processing is conducted as described in accordance with the present invention, with the simultaneous drive-in diffusion of the P well 18 and thermal growth of the oxide regions 42, compounds of silicon, nitrogen, and oxygen will not be present in either the exposed portions of the substrate 16 or the exposed portions of the P well 18. Such compounds would have been formed had the oxidation been conducted in a steam ambient of the type used in the prior art. Accordingly, when the integrated circuit 10 is completed to yield the device shown in FIG. 1, utilizing standard processing steps, the gate oxides 26, 36 will not contain defects resulting from the presence of the silicon nitride layer 50.

In order to complete the integrated circuit 10, an oxide layer is thermally grown to obtain the gate oxide layers 26, 36. An N+ polycrystalline silicon layer is then deposited, and it is defined using a photolithographic step to obtain the gates 28, 38. Then, the sources and drains of the transistors 12, 14 are formed, typically by two separate ion implantation and diffusion steps. Thereafter, the field oxide regions 44 are deposited. The field oxide regions 44 cover the polycrystalline silicon gates 28, 38 and the oxide regions 42. The field oxide regions 44 then have openings defined in them, and a metal layer, typically aluminum, is deposited and photolithographically defined, to obtain the metal conductors 46, thereby completing the integrated circuit 10, shown in FIG. 1.

Figure 6:
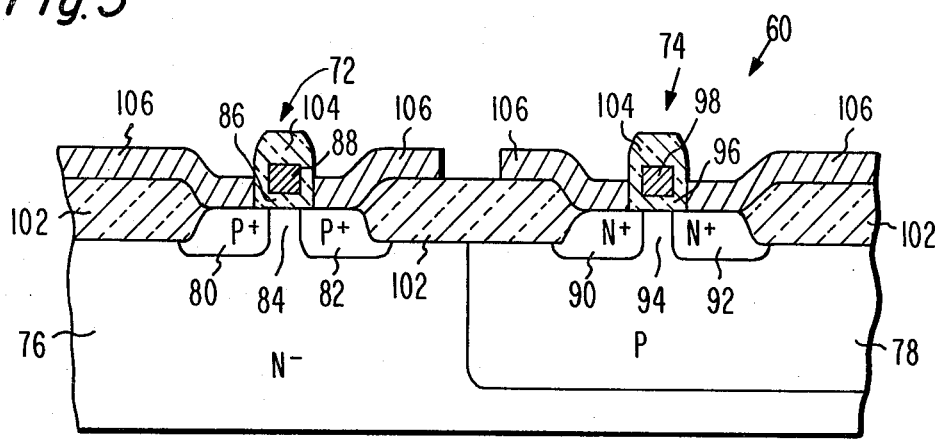
FIG. 6 is a cross-sectional view of another device manufactured in accordance with the present invention.

Referring now to FIG. 6, a cross-sectional view of a portion of a integrated circuit 60 manufactured in accordance with an alternate embodiment of the present invention, namely as LOCOS method, is shown. The integrated circuit 60 comprises a P channel transistor 72 and an N channel transistor 74. The integrated circuit 60 is formed in a substrate 76, which is comprised of N- silicon in the preferred embodiment of the invention. The P channel transistor 72 is formed in the substrate 76. The N channel transistor 74 is formed in a P well 78 which is formed in the substrate 76.

The P channel transistor 72 comprises a P+ source 80 and a P+ drain 82 which are separated from one another by a portion of the N- substrate 76 which acts as the channel region 84 of the transistor 72. A gate oxide layer 86 overlies the channel region 84, and a conductive polycrystalline silicon gate 88 overlies the gate oxide layer 86.

The N channel transistor 74 comprises an N+ source 90 and a N+ drain 92 which are separated from one another by a portion of the P well 78 which acts as the channel region 94 of the transistor 74. A gate oxide layer 96 overlies the channel region 94, and a conductive polycrystalline silicon gate 98 overlies the gate oxide layer 96.

The transistors 72, 74 are separated by oxide regions 102 which extend into the substrate 76 and into the P well 78 in the normal manner used in LOCOS integrated circuits. Overlying the gates 88, 98 are field oxide regions 104. Metal conductors 106 are used to contact the sources 80, 90 and the drains 82, 92 of the transistors 72, 74.

In order to manufacture the device 60 shown in FIG. 6 via a LOCOS process, one starts with an N- silicon substrate on which a layer of approximately 400 to 500 angstroms of silicon dioxide is thermally grown. Thereafter, about 1000 to 3000 angstroms of silicon nitride is deposited on the surface of the silicon dioxide. Then, about 2000 angstroms of silicon dioxide is chemically deposited from vapor onto the surface of the silicon nitride layer. Finally, a photoresist layer is applied to the surface of the deposited silicon dioxide layer.

These processing steps are identical to the steps described above with reference to the isoplanar processing method. The definition of the silicon nitride layer is also accomplished in the same manner as heretofore described. However, the thermally grown silicon dioxide layer is not removed, and the silicon substrate is not etched in the manner described above. Instead, the photoresist implantation mask is applied, defined, and developed. Thereafter, the processing steps described above are continued.

Figure 7:
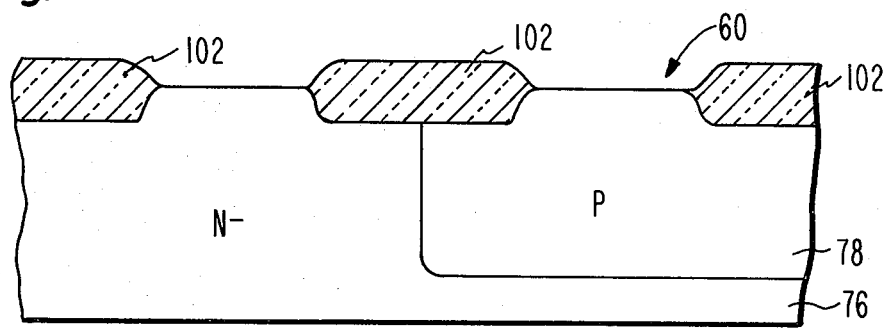
FIG. 7 is a cross-sectional view illustrating the method of manufacturing the device shown in FIG. 6.

As a result of the different procedures used in the LOCOS process with respect to the isoplanar process, the device 60 will have the structure shown in FIG. 7 following the simultaneous drive-in diffusion and thermal oxidation in the dry oxygen ambient. Thus, oxide regions 102 will be formed between the areas where the transistors are to be formed. Thereafter, the device 60 is completed by thermally growing an oxide layer on the exposed portions of the substrate 76 and the P well 78 in order to obtain the gate oxide layers 86, 96. An N+ polycrystalline silicon layer is then deposited. Then, it is defined using a photolithographic step to obtain the gates 88, 98. Next, the sources and drains of the transistors 72, 74 are formed, typically by two separate ion implantation and diffusion steps. Thereafter, the field oxide regions 104 are deposited. The field oxide regions 104 cover the polycrystalline silicon gates 88, 98 and the oxide regions 102. The field oxide regions 104 then have openings defined in them, and a metal layer, typically aluminum, is deposited and photolithographically defined to obtain the metal conductors 106, thereby completing the integrated circuit 60, as shown in FIG. 6.

In the claims:

1. An improved method for manufacturing a complementary symmetry metal oxide semiconductor integrated circuit comprising the steps of:
   (a) forming an oxide layer on the surface of a semiconductor substrate of a first conductivity type;
   (b) forming a silicon nitride layer on the surface of said oxide layer;
   (c) defining said silicon nitride layer to cover areas where transistors will be formed in said substrate; and
   (d) applying a photoresist layer over said defined silicon nitride layer; wherein the improvement comprises the steps of:
   (a) defining openings in said photoresist layer over areas where well regions of opposite conductivity type to said substrate will be formed;
   (b) implanting ions through said defined silicon nitride layer, through the underlying portions of said oxide layer and into said substrate;
   (c) removing said photoresist layer;
   (d) simultaneously driving said implanted ions into said substrate while growing a thermal oxide by heating said substrate in a dry oxygen ambient;
   (e) removing the silicon nitride layer and any underlying silicon dioxide portions; and
   (f) growing a gate oxide layer.

2. The method of claim 1 wherein said semiconductor substrate is comprised of silicon.

3. The method of claim 3 wherein said oxide layer comprises a layer of silicon dioxide.

4. The method of claim 3 wherein said silicon substrate is comprised of N type silicon.

5. The method of claim 4 further comprising the step of removing the portions of said oxide layer which do not underlie said defined silicon nitride layer prior to said step of applying a photoresist layer.

6. The method of claim 5 further comprising the step of removing portions of said semiconductor substrate which are exposed following the removal of said exposed portions of said oxide layer.

7. The method of claim 6 further comprising the step of forming an oxide layer on said exposed portions of said substrate.

* * * * *